United States Patent [19]
Miller

[11] Patent Number: 4,716,449
[45] Date of Patent: Dec. 29, 1987

[54] NONLINEAR AND BISTABLE OPTICAL DEVICE

[75] Inventor: David A. B. Miller, Fairhaven, N.J.

[73] Assignee: American Telephone and Telegraph Company AT&T Bell Laboratories, Murray Hill, N.J.

[21] Appl. No.: 6,327

[22] Filed: Jan. 14, 1987

Related U.S. Application Data

[63] Continuation of Ser. No. 785,546, Oct. 8, 1985, abandoned, which is a continuation-in-part of Ser. No. 589,556, Mar. 14, 1984, Pat. No. 4,546,244.

[51] Int. Cl.[4] .......................................... H01L 27/14
[52] U.S. Cl. .......................................... 357/30; 357/4; 357/56; 357/58
[58] Field of Search ................... 357/30, 17, 4 SL, 58, 357/56; 250/211 J

[56] References Cited
PUBLICATIONS

Wood et al., *Appl. Phys. Lett.*, 44(1), 1 Jan. 1984, pp. 16–18.
Bohnert et al., *Appl. Phys. Lett.*, 43(12), 15 Dec. 1983, pp. 1088–1090.
Hajto et al., *Philosophical Magazine B*, 1983, vol. 47, No. 4, pp. 347–366.

*Primary Examiner*—Martin H. Edlow
*Attorney, Agent, or Firm*—Bernard Tiegerman

[57] ABSTRACT

The invention is a nonlinear or bistable optical device having a low switching energy. The invention uses a means responsive to light for generating a photocurrent, a structure having a semiconductor quantum well region, and means responsive to the photocurrent for electrically controlling an optical absorption of the semiconductor quantum well region. The optical absorption of the semiconductor quantum well region varies in response to variations in the photocurrent. A photodiode or phototransistor may be used as the means responsive to light, and may be made integral with the structure having the semiconductor quantum well region. An array of devices may be fabricated on a single chip for parallel logic processing.

7 Claims, 33 Drawing Figures

NONLINEAR AND BISTABLE OPTICAL DEVICE

This is a continuation of application Ser. No. 785,546, filed Oct. 8, 1985 now abandoned which is continuation-in-part of U.S. patent application Ser. No. 589,556 field on Mar. 14, 1984, U.S. Pat. No. 4,546,244.

TECHNICAL FIELD

This invention relates to nonlinear optical devices, particularly to those devices employing high gain or feedback resulting in multistable optical states or other nonlinear optical response.

BACKGROUND OF THE INVENTION

Nonlinear and bistable optical devices for use in computing and switching systems must have a low switching energy. A low switching energy allows many similar devices to be packed into a small volume for parallel processing, and also allows high speed switching to be implemented.

Nonlinear and bistable optical devices have in the past required a high switching energy. They have therefore relied upon the high gain of a high finesse optical cavity such as a Fabry Perot Cavity in order to reduce the switching energy needed for either nonlinear or bistable operation. A bistsable optical device having a low switching energy is described by D. S. Chemla- D. A. .B. Miller-P. W. Smith in U.S. patent application Ser No. 566,968. The optical switching energy between bistable states of the Chemla et al. device was somewhat greater than 100 femtojoules/square micron. However a high finesse Fabry Perot cavity was required in order to achieve this low value of the switching energy is the Chemla et al. device.

SUMMARY OF THE INVENTION

The invention is a nonlinear or bistable optical device having a very low switching energy. The optical switching energy is approximately 4 femtojoules/square micron and the total switching energy, including electrical energy, is approximately 20 femtojoules/square micron. The low switching energy is achieved by the use of a material capable of absorbing light and thereby generating photocurrent. A voltage responsive to the photocurrent is applied to a structure having a semiconductor quantum well region in order to cause the optical absorption of the semiconductor quantum well region to vary in response to variations in the photocurrent. Also the variations in absorption in the semiconductor quantum well region may influence the absorption of the material capable of absorbing light so as to provide a feedback path resulting in nonlinear and bistable optical operating conditions.

DETAILED DESCRIPTION

Figure 1:
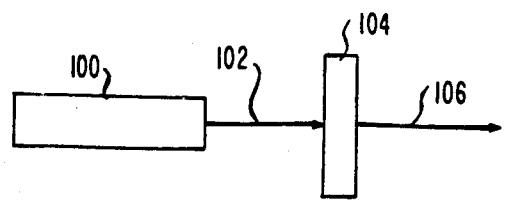
FIG. 1 is a schematic diagram showing the invention.

FIG. 1 is a schematic diagram of an exemplary embodiment of the invention. Light source 100 generates the input light beam 102 which is incident upon material 104. A fraction of input light beam 102 emerges from material 104 as output light beam 106. Material 104 may be a single material structure or material 104 may have a number of components such as an electronic circuit.

Figure 2:
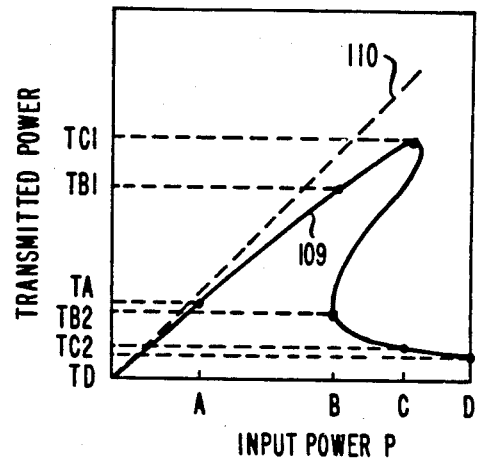
FIGS. 2 and 3 are graphs showing operating characteristics of the invention.
Figure 3:
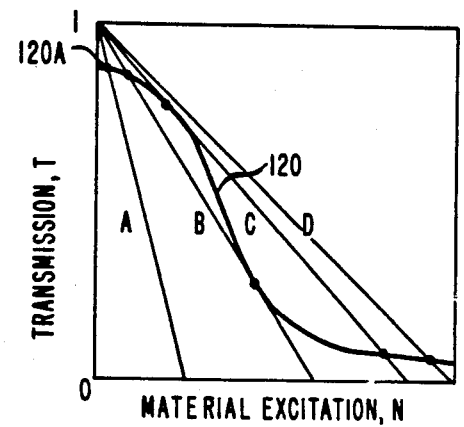

The optical characteristics of material 104 are set out in FIG. 2 and FIG. 3. The principles of optical absorption exhibited by material 104 are: first, that an increasing intensity of input light beam 102 leads to an increasing absorption coefficient by material 104; and second, a positive feedback mechanism is exhibited by material 104 such that increasing absorption of light energy by the material 104 leads to an increasing optical absorption coefficient. As a consequence of these two principles the material 104 switches between stable optical states of transmission.

The behavior of material 104 under variations in intensity of input light beam 102 is given in FIG. 2. However in the following discussion the units of beam power are used rather than intensity. Beam power is expressed in units of Watts and beam intensity in units of Watts per square meter. Beam power is the integral of intensity over a cross section perpendicular to the axis of the light beam. Units of power are more useful in the following discussion because material 104 responds to beam power, and more particularly to power absorbed by material 104. In FIG. 2, the power in input light beam 102 is plotted along the horizontal axis. Along the vertical axis the power in output light beam 106 is plotted as transmitted power. At an input power of value A, the transmitted power is given by a value of TA, as shown in FIG. 2. As the input power is increased to a value of B, the transmitted power increases to a value of TB1. However the absorption coefficient of material 104 increases with increasing input power, and therefore the transmission curve 109 from input power A to input power B is below a line of constant slope such as line 110. A further increase of input power from value B to value C results in a further increase in absorption coefficient so that the transmission of material 104 becomes unstable and switches from a value of TC1 to a value of TC2. A further increase of input power to a value of D leads to a value of transmission such as the value TD.

Decreasing the intensity of light beam 104 results in the transmitted power tracing along the curve 109 to input power B, whereupon the absorption coefficient of material 104 switches to a smaller value, and the transmitted power increases to the value TB1. Material 104 is said to exhibit optical bistability because material 104 switches from a state of high transmission to a state of low transmission as the optical input power is increased, and switches back to high transmission as the optical input power is decreased. However, optical bistability may exist for other sequences of switching.

FIG. 3 gives an exemplary set of characteristics of material 104 which lead to optical bistability. The optical absorption is assumed to be a function of material excitation. Also the material excitation is assumed to be a function of optical power absorbed by material 104. These two assumptions lead to two simultaneous equations whose graphical solution is shown in FIG. 3. Let A represent the optical absorption and let N represent the material excitation. The first assumption is expressed generally by Equation (1).

$$A = A(N). \tag{1}$$

In FIG. 3 transmission, represented by T, is plotted, and T is defined as:

$$T = 1 - A. \tag{2}$$

The plot of transmission T versus material excitation N from Equation (1) is shown by curve 120. Curve 120 shows an increasing optical absorption, hence a decreasing transmission T, as the material excitation N increases.

The second assumption, expressed in Equation (3), is that material excitation N is proportional to the absorbed power. The incident optical power is represented by P and so the absorbed optical power is AP, giving for the material absorption:

$$N = y A P. \tag{3}$$

The symbol y represents a proportionality constant. In FIG. 3 straight lines are obtained by plotting Equation (3) as transmission T versus material excitation N for fixed values of input power P. Straight lines are plotted in FIG. 3 for values of input power shown in FIG. 2 as values A, B, C, and D, and the straight lines of FIG. 3 are correspondingly labeled A, B, C, and D.

The intersection 120A of curve 120 and line A gives the transmitted power shown as TA in FIG. 2. There are two intersections of curve 120 and line B in FIG. 3, corresponding to the two points TB1 and TB2 of FIG. 2. Line C is drawn tangent to the upper portion of curve 120 (the value C of input power was chosen so that this tangent condition would occur) represented by point TC1 in FIG. 2. Also line C intersects curve 120 at the point corresponding to TC2. Material 104 is unstable when the intensity of input light beam 102 reaches the power represented by value C, and so material 104 switches from transmitted power TC1 to the value given by TC2. A further increase in input power to the value represented by line D in FIG. 3 gives only one intersection between curve 120 and line D, represented by point TD in FIG. 2.

An exemplary embodiment of a material which exhibits bistable switching characteristics and uses sample temperature as the material excitation N, is a GaAs/GaAlAs multiple quantum well (MQW) sample. Hereinafter a multiple quantum well structure is referred to as a MQW structure. MQW structures are more fully disclosed in the U.S. patent applications: D. S. Chemla—P. A. B. Miller—P. W. Smith, Ser. No. 567,222; D. S. Miller—D. A. B. Miller—P. W. Smith, Ser. No. 566,968; and D. S. Chemla—T. C. Danen—A. C. Gossard—D. A. B. Miller—T. H. Wood, Ser. No. 558,545. The sample included 375 periods of $Ga_{0.7}Al_{0.3}As$ layers, 87 Angstroms thick, alternating with 85 Angstrom thick GaAs layers, with this whole structure sandwiched between approximately 1.2 micron thick $Ga_{0.7}Al_{0.3}As$ cap layers, giving a total thickness of approximately 9 microns. The sample was epoxied to a glass fiber in order to provide a mounting with low thermal conductivity. Input light beam 102 was supplied by a laser. The laser wavelength was chosen at a photon energy lower than the exciton resonant peak, but close enough to the peak so that a temperature rise of the sample resulted in the exciton peak shifting into the laser wavelength region, thereby increasing the absorption coefficient of material 104. Thus an increasing temperature of the sample led to an increasing optical absorption. And an increasing absorption led to an increasing sample temperature, which led to an increasing optical absorption. The sample exhibited optical bistable switching as shown in FIG. 2.

Figure 4:
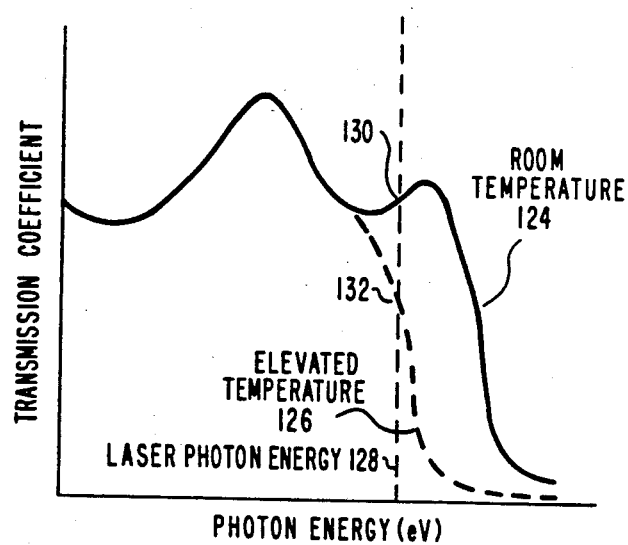
FIG. 4 is a graph showing an optical transmission of the invention.

FIG. 4 shows the optical transmission coefficient of the MQW sample for room temperature at curve 124 and for an elevated temperature by curve 126. The sample was heated to the elevated temperature by absorption of energy from input light beam 102. The laser photon energy is shown by line 128. The sample transmission coefficient decreases from a value 130 to a value 132 as the sample temperature rises, caused by a shift in the optical absorption from curve 124 to curve 126. Thus the sample exhibits optical bistability as discussed above.

Figure 5:
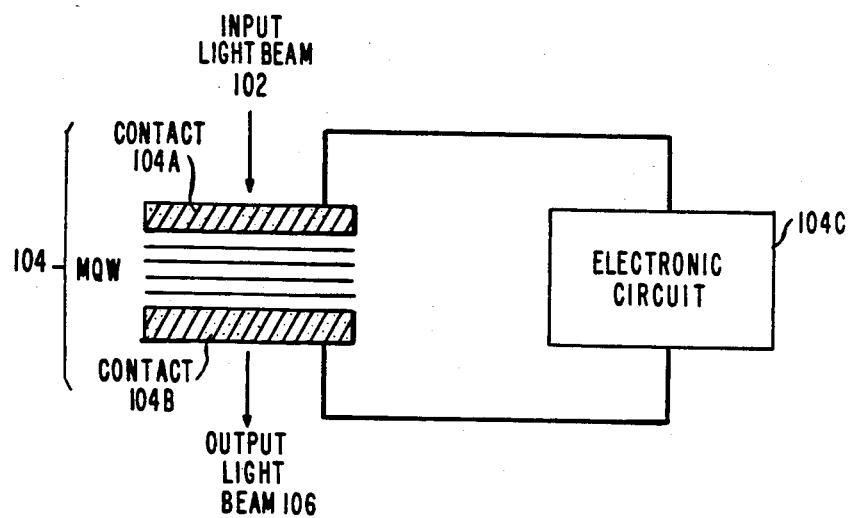
FIG. 5 is a side view showing the invention.

FIG. 5 is a schematic diagram of an exemplary embodiment of the invention as a self-electro-optic effect device (hereinafter a SEED device). The elements of FIG. 5 are labeled in accordance with FIG. 1. Input light beam 102 is directed at material 104. Material 104 includes a MQW structure having electrical contacts 104A, 104B which are in electrical connection with an electronic circuit 104C. The electronic circuit responds to photocurrent produced by absorption of light within the MQW structure and in turn applies a voltage to the MQW and thereby influences the optical absorption properties of the MQW. The name SEED is used for the embodiments of the invention shown in FIG. 5 because the photocurrent produced within the MQW is used to influence the properties of the MQW, hence "self" electro optic effect device. The electronic circuit may be a simple resistor, a coil, supplying inductance, a photodiode, a phototransistor, a constant current source, or other useful electronic circuit. Also the electronic circuit may be made of separate components or it may be integrated into the semiconductor wafer including the MQW structure. A description of a number of embodiments of the invention employing a MQW structure follows.

Figure 6:
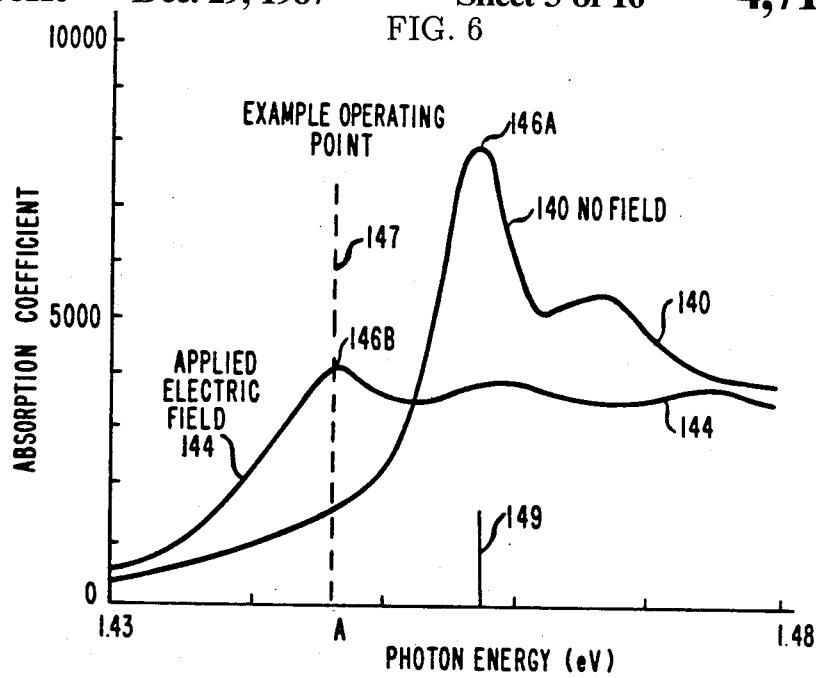
FIG. 6 is a graph showing an optical absorption coefficient of the invention.

The following exemplary embodiments of the invention include a MQW structure as a light absorber. A reason for using a MQW structure as the light absorber is that a small voltage applied to electrical contacts attached to a MQW structure results in a large change in the optical absorption properties of the MQW structure. The influence of an applied voltage on the optical properties of a MQW structure are more fully disclosed in U.S. patent application Ser. No. 558,545 by Chemla et al. mentioned hereinabove. A brief discussion of the influence of an electric field upon the properties of a MQW is aided by reference to FIG. 6. The curves in FIG. 6 show the optical transmission of an undoped (intrinsic) MQW structure with different values of electric field applied to the MQW. The MQW was not intentionally doped, and the level of background doping impurities was less than approximately $5*10^{15}$ cm$^{-3}$. The electric field was applied by sandwiching the intrinsically doped MQW between a p doped contact, 104A, and an N doped contact 104B. The MQW then served as the intrinsic (i) region of a pin diode. The pin diode was backbiased in order to shift the diode "built in field" completely into the MQW layer region. The optically active MQW region can be switched from a low electric field at 0 applied Volts as shown in curve 140 to a field of approximately $7.3*10^4$ V/cm as shown in curve 144 by the external application of approximately 8 Volts across the p and n contacts 104A and 104B. The optical absorption is increased dramatically at the exemplary operating point chosen at photon energy A, when the electric field is applied to the MQW. The heavy hole exciton resonance 146A at zero applied voltage shifts to resonance peak 146B at the applied electric field of $7.3*10^4$ V/cm.

Figure 7:
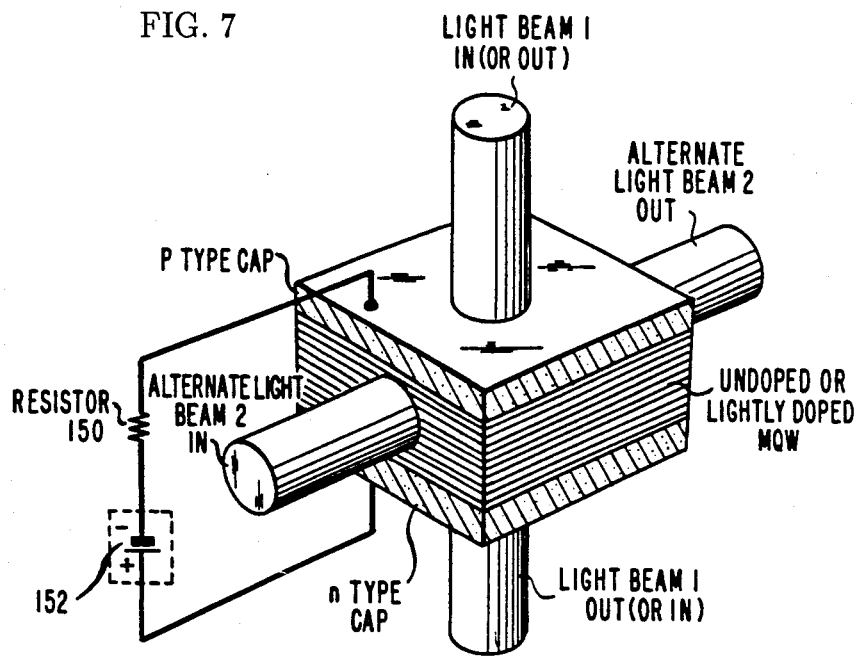
FIG. 7 and FIG. 8 are isometric schematic views showing the invention.
Figure 8:
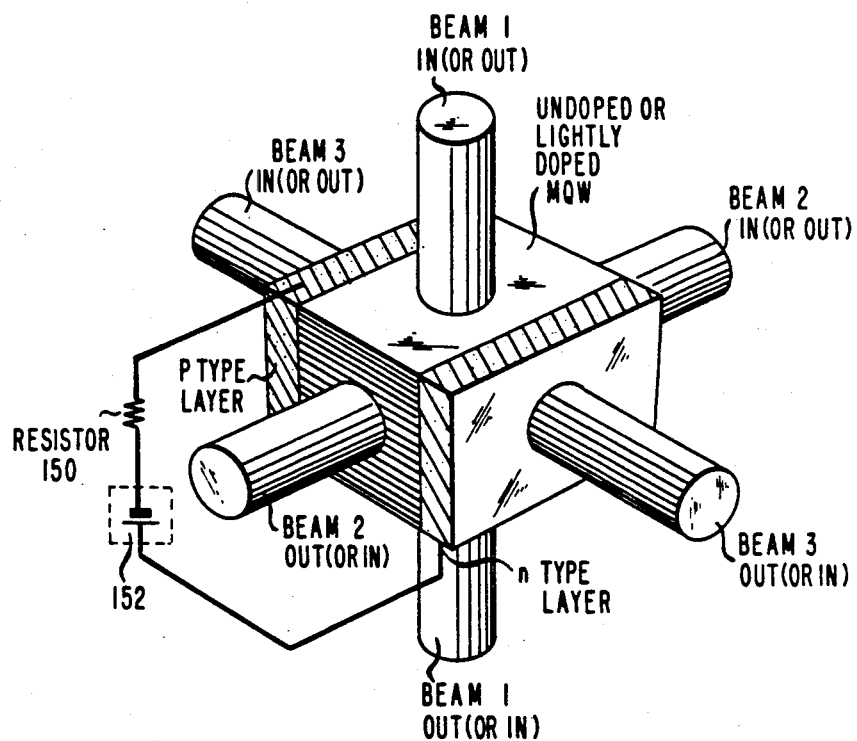

FIG. 7 and FIG. 8 show an exemplary embodiment of the invention having a MQW as the intrinsic region (i) of a pin diode, with the electronic circuit 104C being a simple resistor 150 and a voltage source 152. Voltage source 152 is optional, and is set to zero Volts for the following discussion. In FIG. 7 the p and n electrical contact layers are parallel to the layers of the MQW. In FIG. 8 the electrical contact layers are perpendicular to the layers of the MQW. For the embodiments having light beams perpendicular to the layers of the MQW, the cap layers must be transparent at the operating wavelengths. For embodiments having light beams parallel to the layers of the MQW, it may be necessary to have only one or two quantum well layers, rather than a multiple number. However the name MQW will be used to include structures having only one or two quantum well layers. In operation, the diode has a built in electric field. The layers of the pin structure are arranged so that in the absence of an externally applied voltage, the MQW lies substantially within the "built in field". Thus in the absence of a light beam the MQW will have an optical absorption altered from its zero electric field value. On applying an optical beam which is partially absorbed by the MQW layers, electrons and holes are created. The electrons and holes move in such a way in the electrical circuit as to partially cancel the "built in field". Thus the electric field across the quantum wells will be reduced. This reduction in electric field applied to the quantum wells will in turn alter the absorption and refraction of the quantum wells. Embodiments of the invention are also possible in which the MQW structure is not contained in a pin diode configuration, in which case the contact regions in FIG. 7 and FIG. 8 need not be p and n doped.

A numerical example based on the embodiment of FIGS. 7 and 8 shows that a 1 milliwatt light beam of 1.5 eV photons will produce a photocurrent of approximately 0.66 mA, assuming unit quantum efficiency (all of the light absorbed). For a resistor of 1000 Ohms, this current will produce a voltage drop of 0.66 Volt. Such a voltage will reduce the "built in field" for a semiconductor with a 1.5 electron volt bandgap by approximately (1.5–0.66)/1.5, a factor of approximately 0.56. Such a large change in the electric field applied to the MQW structure produces a significant change in the optical absorption and the index of refraction. The response time of a device having a 10 micron$\times$10 micron$\times$1 micron volume with electrodes parallel to the MQW planes and the 10 micron faces may be estimated. The capacitance of the device is approximately $1.2*10^{-14}$ Farad for a dielectric constant of 13. With a 1000 Ohm resistor, the RC time constant is approximately 12 picoseconds, and this time is comparable to the sweep out time for a 1 micron thick device.

Also a direct current reverse bias may be applied to the p and n contacts by using the optional voltage source 152. The photocurrent will alter the "built in field" and modify the optical absorption and transmission of the MQW layers.

An example of absorptive optical bistability based on an exemplary embodiment of the invention has the electro optical absorption characteristics shown in FIG. 6. Absorptive bistability is based upon a reduction in absorption with increasing optical intensity. A MQW structure is placed within a Fabry-Perot cavity formed, for example, from mirrored electrodes. As the intensity of the light beam is increased from zero, absorption occurs in the MQW material. This absorption produces a photocurrent. The photocurrent gives a voltage drop across the resistor 150, which reduces the voltage across the MQW, thereby reducing the applied electric field within the MQW and moving the absorption spectrum from curve 144 towards curve 140. The absorption within the MQW is thereby reduced. As the absorption inside of the Fabry-Perot cavity is reduced, the cavity quality factor increases giving more resonant built up optical field within the cavity. With a saturable absorber this process has a positive feedback, the process becomes regenerative, and the cavity switches on with increasing incident intensity. Using this exemplary embodiment of the invention, the absorption is saturable and bistable switching occurs.

An example of refractive bistability based on an exemplary embodiment of the invention having the electro optical absorption characteristic shown in FIG. 6 follows. Refractive bistability is based upon a change in refractive index with increasing optical intensity. A MQW structure is placed within a Fabry-Perot cavity formed, for example from mirrored electrodes. As the intensity of the light beam is increased from zero, absorption occurs in the MQW material. This absorption produces a photocurrent. The photocurrent gives a voltage drop across the MQW, thereby reducing the applied electric field within the MQW and moving the absorption spectrum from curve 144 towards curve 140. The resulting change in absorption spectrum also changes the refractive index of the MQW as can be described through the Kramers-Kronig relations. This change in refractive index changes the resonant condition of the cavity because it changes the optical path length inside the MQW. With appropriately chosen operating wavelength, this change in refractive index will move the cavity towards the resonant condition with a consequent further increase in optical intensity inside the cavity. A further increase in intensity gives increased photocurrent and hence further change in refractive index, and hence the device can switch into a near resonant condition due to such a regenerative process. Using this exemplary embodiment of the invention, the refractive index depends on the incident optical power and bistable switching occurs.

Whether the device operates through absorptive or refractive bistability or some combination of the two depends upon the choice of wavelength and other parameters.

The presence of an applied voltage produced by optional battery 152 has several advantages including: the presence of an electric field which helps to sweep out charge carriers from the MQW, thereby making switching faster; and the ability to tune the operating point by shifting the absorption spectrum towards curve 140 or towards curve 144.

Figure 9:
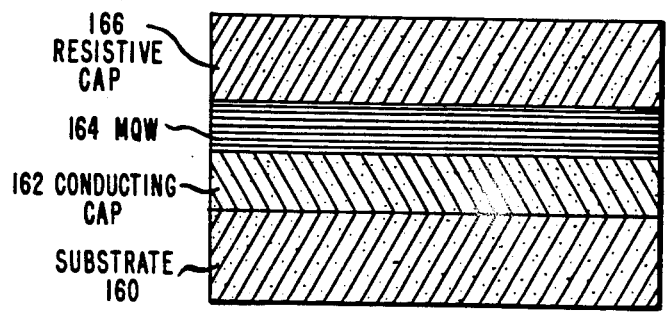
FIG. 9 and FIG. 10 are side views showing making the invention.
Figure 10:
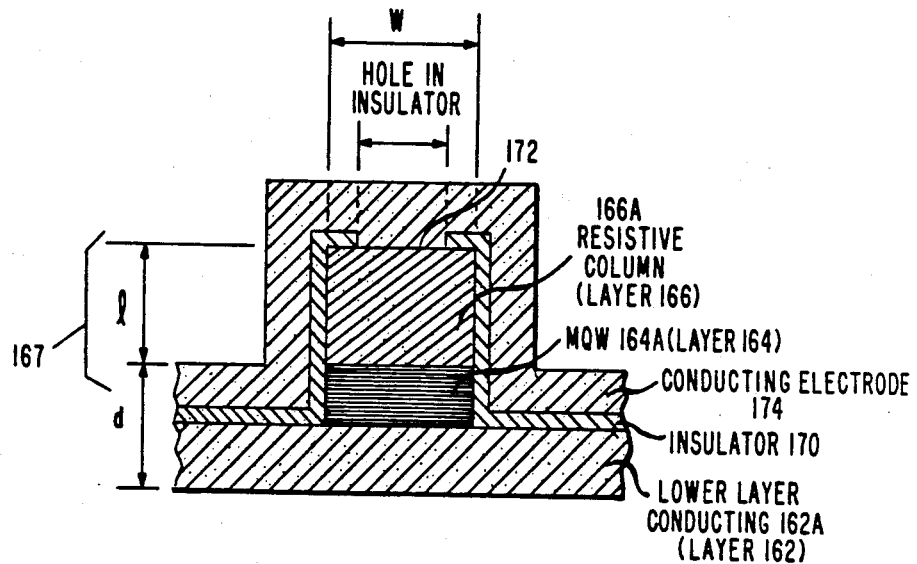

FIGS. 9 and 10 show steps for growing an exemplary integrated embodiment of the invention. In FIG. 9 substrate 160 has first a conducting cap layer 162 grown upon it. Then a MQW structure 164 is grown upon the conducting cap layer 162, and finally a resistive cap layer 166 of controlled thickness is grown upon MQW structure 164. A mesa 167 of the layers shown in FIG. 9 is produced by etching, an insulating layer 170 is deposited over the mesa, and a hole 172 is produced in the insulating layer so as to expose the top of resistive cap layer 166. In the mesa, resistive cap layer 166 becomes resistive column 166 A. Finally a conducting electrode 174 is deposited over insulating layer 170, thereby providing electrical contact to resistive column 166A through hole 172. A potential may be applied to the MQW 164A by making electrical contact to conducting layers 174 and 162A. The substrate may be removed if it is not transparent at the operating wavelength. The resistive column 166A has a length l and width w, and its resistance is easily controlled by control of l and w and also the doping concentration used when manufacturing layer 166. Resistive column 166A serves as resistor 150 as shown in FIGS. 7 and 8. An exemplary embodiment of the invention using zero bias may be made by simply electrically connecting electrode 174 with conducting layer 162A. Alternatively, a voltage source such as a battery 152 may be connected between conducting electrodes 174 and 162A.

Figure 11:
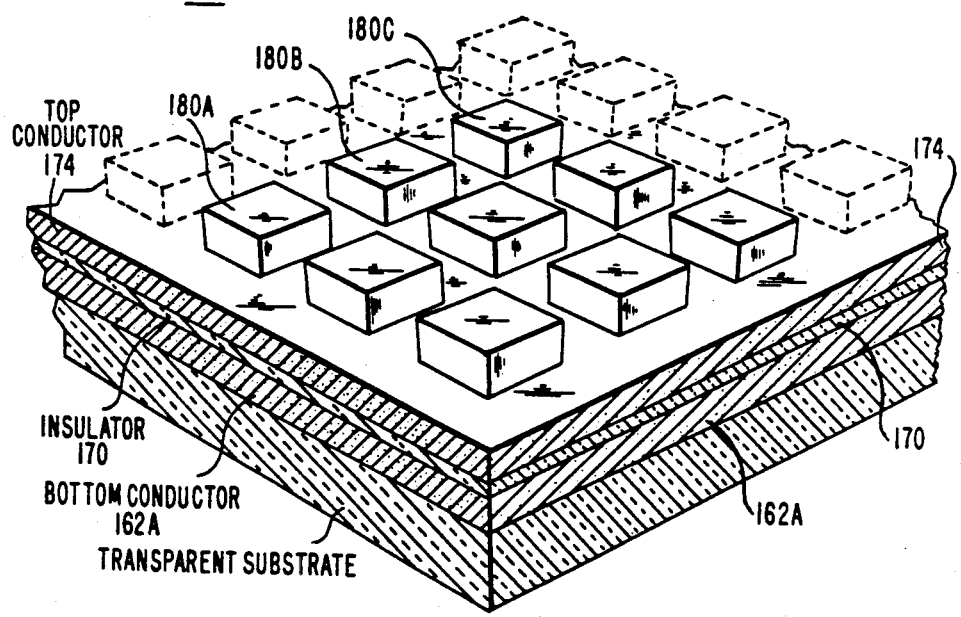
FIG. 11 is an isometric view showing the invention as an array of discrete devices.

FIG. 11 shows an exemplary embodiment of the invention as an array 180 of devices such as the one shown in FIG. 10. The process steps used in making the one device shown in FIG. 10 are particularly well suited to make an array of devices as shown in FIG. 11. Layers in FIG. 11 are given reference numbers assigned to the corresponding layers shown in FIG. 10. Each individual device in the array, such as 180A, operates independently of all other devices in the array. This independence results from the electrical independence of each device in the array, and from the fact that each device has its own load resistor 166A. Also if an external electric voltage is applied to devices 180A, 180B, 180C . . . , then only two connections need be made to array 180, and all devices are connected through electrodes 174 and 162A. Devices 180A, 180B, 180C . . . may be used to perform parallel processing on independent light beams, and the logic performed by each device is independent of the logic performed by any other device. For example, more than one independent light beam may be directed at each device 180A . . . in order to perform AND or OR logic using the bistable properties or other properties of the devices. Also arrays 180 may be stacked one upon the other to perform further logic operations.

Figure 12:
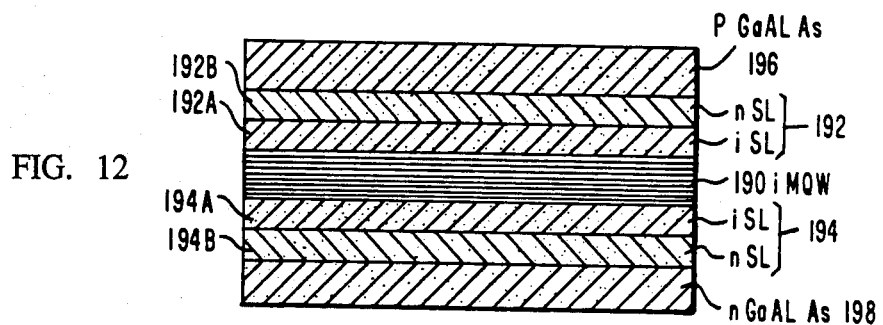
FIG. 12 is a side view showing the invention employing a pin diode structure.

An exemplary embodiment of the invention was made using the circuit shown in FIG. 7, choosing the battery polarity so as to reverse bias the pin diode, using a light beam perpendicular to the MQW layer planes, and using a semiconductor body shown in FIG. 12. The MQW layers 190 are 50 GaAs quantum well layers of 95 Angstrom thickness separated by 98 Angstrom GaAlAs barrier layers, all with no intentional doping. The total MQW thickness is approximately 0.96 micron. Superlattice buffer layers 192, 194 were used to protect the intrinsic doped MQW layers 190 from doping in the contact layers. Superlattice buffer layers 192, 194 are 0.29 microns thick, with layers of GaAs of thickness 28.5 Angstroms thick alternating with 68.5 Angstrom GaAlAs layers. Layers 192A adjacent to the MQW 190 are undoped, that is they have intrinsic or background doping. Layers 192B have p doping for contact with the p doped contact layer 196. Layer 196 is $Ga_{0.68}Al_{0.32}As$ of 0.98 microns thickness and has p doping concentration of approximately $5*10^{17}$ cm$^{-3}$. Layers 194A are undoped, that is they have intrinsic doping for contact with MQW 190. Layers 194B have n doping for contact with the n doped contact layer 198. Layer 198 is also $Ga_{0.68}Al_{0.32}As$ of 0.98 micron thickness and has an n doping having a concentration of approximately $5*10^{17}$ cm$^{-3}$. The intrinsic layers have a p type background doping of approximately $2*10^{15}$ cm$^{-3}$. This device was grown by molecular beam epitaxy on a Si doped [100] GaAs substrate (not shown). The device was defined laterally by an approximately 600 micron diameter mesa etched from the layers. A small hole was etched through the opaque substrate (not shown) by a selective etch. Metal contacts were electrically attached to the doped contact layers 196, 198. The capacitance of the device is approximately 20 pF.

The structure forms a pin diode with the MQW layers 190 within the intrinsic (i) layer. The active layer can be switched from a low field to approximately $7.3*10^4$ Volts/cm by the application of approximately 8 Volts between layers 196, 198. The sample used as described in detail in the article by Wood et al. in Applied Physics Letters, Vol. 44, page 16, 1984.

When a reverse bias is applied to the semiconductor structure shown in FIG. 12, then an electric field is applied to MQW layers 190 and the absorption spectrum near the bandgap shifts to lower energies with some broadening of the exciton peak, as shown in FIG. 6. A photocurrent is produced by this light absorption.

In reverse bias approximately one photocarrier is collected for every photon absorbed. Only at reverse bias less than approximately 2 Volts does the quantum efficiency drop off, probably because the depletion region does not then extend all the way through the MQW.

Figure 13:
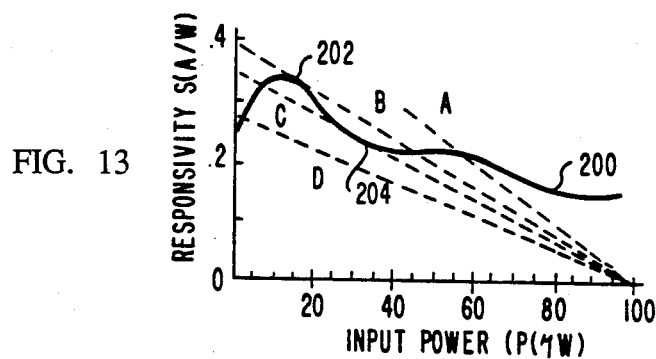
FIG. 13 and FIG. 14 are graphs showing operating characteristics of the invention.

The responsivity S of the semiconductor structure shown in FIG. 12 is given as a curve 200 in FIG. 13. The responsivity S is the photocurrent produced per unit of incident light power, and is expressed in the units of Amperes per Watt of incident light power. Curve 200 shows the responsivity S for a laser used as the light source, and the laser tuned to a photon energy of 1.456 eV (851.7 nm). This photon energy is approximately the heavy hole resonance energy at conditions of zero bias for the MQW structure used. As the reverse bias is increased, the responsivity first increases as photocurrent collection becomes complete, and then decreases as the exciton absorption peak moves to lower energy, as shown in FIG. 6. The subsequent "bump" between 8 V and 16 V in curve 200 is due to the light hole exciton resonance similarly moving past the measuring wavelength.

The input-output characteristics of the device when connected with a resistor between the device and the source of potential as shown in FIG. 7, may be calculated with the aid of a graphical solution of two simultaneous equations. The graphical solution is similar to the solution of Eq. 1, Eq. 2 and Eq. 3, as discussed hereinabove, and as shown in FIG. 2 and FIG. 3. The first equation is the measured responsivity of the MQW structure as shown in FIG. 13 as curve 200, and which relationship is written in a general form as:

$$S = S(V) \tag{4}$$

The second equation is $V = V_O - RSP$, where P is the optical input power and V is the voltage across the diode, when written as:

$$S = \frac{V_o - V}{RP} \tag{5}$$

The straight lines given by Eq. 5 are shown plotted as dashed lines in FIG. 13, for different values of the product RP. Straight lines A and D have only one intersection with curve 200, and represent stable operating points. Straight lines B and C have tangent points 202 and 204 with curve 200. The tangent points 202, 204 represent unstable switching points. All straight lines between lines B and C have three intersection points with curve 200, and the middle point represents unstable operation.

Figure 14:
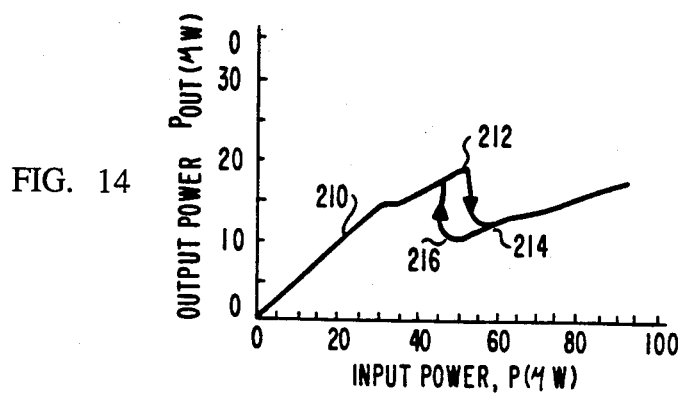

In FIG. 14 bistable switching of the device is shown. As input power is increased the output power increases along curve 210 up to the point 212. As the input power passes point 212 the operating point reaches a tangent point 204, the device becomes unstable and switches to point 214, a state of low transmission. Further increases in input power lead to increases in output power. Reducing input power leaves the device in the state of low transmission until the operating point reaches the other tangent point 202, at which input power, represented by point 216, the device switches to a state of high transmission. The bistable operation of this device is similar to the operation outlined in FIG. 1, FIG. 2, and FIG. 3, where here the material excitation N is the photocurrent.

Table 1 shows values of switching power, switching time, RC time constant, and switching energy obtained with the device shown in FIG. 12 and FIG. 7.

TABLE 1

| Resistance megohm | Switching Power microwatt | Switching Time microsecond | Time Constant microsecond | Switching Energy nanojoule |
|---|---|---|---|---|
| 100 | 0.67 | 1,500 | 2,000 | 1.0 |
| 10 | 6.5 | 180 | 200 | 1.2 |
| 1 | 66. | 20 | 20 | 1.3 |
| 0.1 | 660. | 2.5 | 2. | 1.7 |
| .022 | 3,700 | .4 | .44 | 1.5 |

The device operates over a broad range of parameters, as can be seen from Table 1. The switching power and speed can be chosen over a range of nearly $10^4$, as shown in Table 1. Optical bistability occurs over a range of voltages from 15 Volts through the highest used, 40 Volts. The device operation is insensitive to spot size from less than a 10 micron diameter spot size up to the maximum used of 100 microns diameter. And this insensitivity to spot size is as expected for a device responsive to optical power, as is the exemplary device. Optical bistability was also observed over a range of operating wavelengths of 850 to 860 mm.

The device does not require any time varying voltages for its operation. However increases and decreases of approximately 0.8 Volt can switch the device from high to low transmission, respectively, near 20 Volts bias.

The device is large (600 microns) by optical standards and consequently has a large capacitance and a moderately low switching energy. The observed values of switching energy are approximately 1 nanojoule incident optical energy and less than 4 nanojoule dissipated electrical energy at 20 Volts bias. The switching energy per unit area is approximately 4 femtojoules per square micron incident optical energy and approximately 14 femtojoules per square micron electrical energy. With smaller devices faster and lower energy operation is possible.

Figure 15:
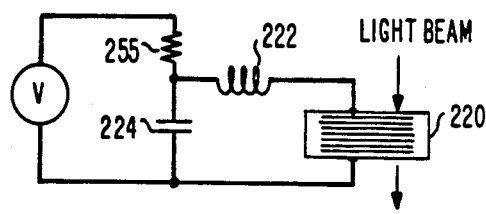
FIG. 15 is a schematic diagram showing the invention using an inductance coil to make an optical oscillator.

An exemplary embodiment of the invention as a negative resistance oscillator is shown in FIG. 15. The semiconductor structure 220 shown in FIG. 12 was connected in a circuit containing an induction coil 222 of approximately 97 millihenry, a capacitor 224 of 1 microfarod, and a resistor 225 of 100 kilohms, as shown in FIG. 15. The intrinsic capacitance of approximately 20 pF of the semiconductor structure 220 together with other stray capacitances and the 97 millihenry induction coil 222 form a LC circuit which operates with the semiconductor structure as a negative resistance amplifier. The 1 microfarad capacitor 224 serves as an AC short on the bias supply. With 7 volts reverse bias, and 70 microwatts of steady laser power at 851.6 nanometers the circuit oscillated at a frequency of approximately 56 kilohertz. The transmitted light beam was detected by an avalanche photodiode. The intensity of the transmitted light beam varied at the oscillation frequency and an electrical signal measured between conductive cap layers 196, 198 varied at the oscillation frequency.

Figure 16:
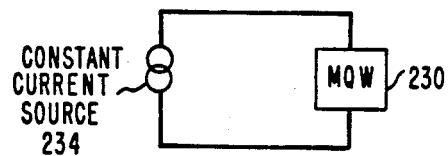
FIG. 16 is a schematic diagram of the invention using a constant current source.

The exemplary embodiment of the invention using a constant current source is shown in FIG. 16. The MQW 230 may serve both as a light modulator and a light detector, and the response of the MQW depends upon the voltage applied across the MQW. The absorption of the MQW, represented by A, may either increase or decrease with increasing voltage applied to the layers of the MQW. Whether the absorption A increases or decreases with voltage applied to the MQW depends upon a number of factors, including the light wavelength operating point, the location of the "built in field" when the MQW is mounted in a pin diode structure, and the movement of the "built in field" under the influence of an applied external voltage. FIG. 6 shows an example of an operating point, labeled A, having an increased absorption with increased electric field applied to the MQW layers. For cases in which the internal electric field increases with applied external voltage, then the example operating point A in FIG. 6 gives increasing absorption with increasing external voltage. However if an operating point 149 near the 0 field exciton peak 146A is chosen, the absorption decreases with increasing applied voltage.

Figure 17:
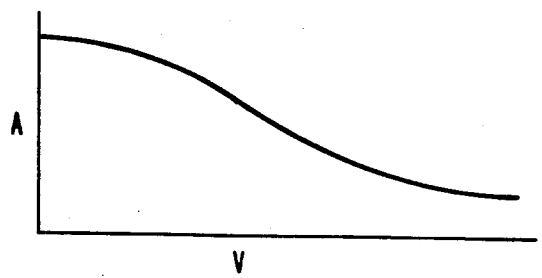
FIG. 17, FIG. 18, and FIG. 19 are graphs showing operating characteristics of the invention.

A first example has a MQW structure in which the optical absorption decreases with increasing voltage as shown in FIG. 17. A constant current source is a source whose current is independent of the voltage across the load. The load in this example is the MQW structure. One way of modeling a constant current source is to approximate it by a large voltage source $V_o$ in series with a large resistor R. When the voltage across the load is low compared to the hypothetical voltage V, when the current through the load is approximately constant at a value $I_c = V/R$. This approximation becomes arbitrarily exact as V and R tend to arbitrarily large numbers. The constant current source of FIG. 16 will therefore be approximated as a battery of voltage $V_o$ and a resistor of resistance R. Then the absorption A as a function of current I in the circuit increases with current as shown by curve 240 in FIG. 18, because the current I flowing in the circuit is photocurrent and:

$$V = V_O - IR \qquad (6)$$

In equation (6) V is the voltage applied to MQW 230, $V_o$ is the potential supplied by the constant current source 234 model battery (not shown), and R is the resistance of the resistor used in the model constant current source. The photocurrent I flowing in the circuit is given by:

$$I = yAP. \qquad (7)$$

Figure 18:
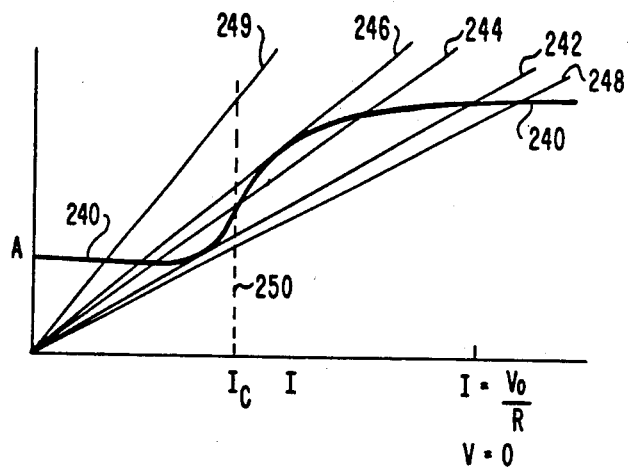

In equation (7) P is incident optical beam power and y is a proportionality constant. Plots of A versus I using Eq. 7 are shown in FIG. 18 as straight lines 242, 244, 246, 248, and 249. The device operating point is determined by the simultaneous solution of A versus current given by curve 240 and the straight lines given by Eq. 7. Lines such as lines 244 have three points of intersection with curve 240 and hence represent unstable solutions which lead to optical bistability. Lines 242 and 246 have a tangent point and represent unstable switching points. Lines 248, 249 have only one point of intersection with curve 240 and so represent stable operating points. As $V_o$ and R are made large, the characteristic 240 of A versus I can become very steep at $I_c$. The value $I_c$ is shown as line 250. An advantage of the constant current source is that it is easier to obtain the necessary multiple intersections of straight lines and curve 240 because the curve 240 is steepened relative to the curve obtained with a constant potential source. Thus bistability can be obtained even for absorptions A which change comparatively slowly with voltage V across the MQW structure.

Figure 19:
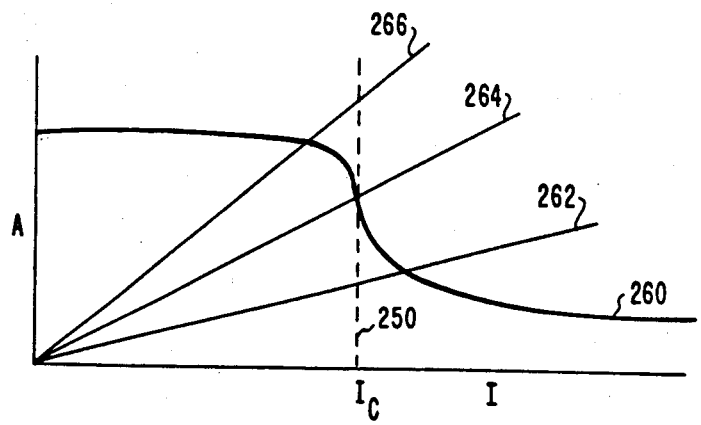

A second example of a constant current driven MQW SEED device has a structure in which the optical absorption A increases with increasing voltage. The optical absorption A then has the general form as a function of current I as is shown in FIG. 19 by curve 260. Straight lines 262, 264, 266, are plotted in FIG. 19 from Eq. 7. All lines from Eq. 7 have only one intersection with curve 260 and so represent stable operating points. The photocurrent created by power absorbed in the MQW passes through the constant current source 234. The constant current source 234 may be set to attempt to make a "set" current $I_c$ pass through MWQ 230. If the light power is very low and the photocurrent is below the set current then the constant current source attempts to adjust the photoabsorption to increase the photocurrent, but because of the low light power the constant current source is unable to achieve raising the photocurrent to equal the "set" current. As the light power is increased, the light power for which the photocurrent can equal the "set" current is passed. For higher light powers the constant current source will decrease the photoabsorption in order to maintain equality between the photocurrent and the "set" current. Therefore, the constant current source maintains a constant absorbed power in the MQW. The device thus operates as a linear inverting modulator in which the absorption is linear with the "set" current. The modulator is inverting because as the "set" current is increased the transmitted intensity is decreased in order to increase the absorbed power. In the limit of an ideal constant current source the curve 260 can become very steep in the vicinity of the set current value $I_c$ 250.

Figure 20:
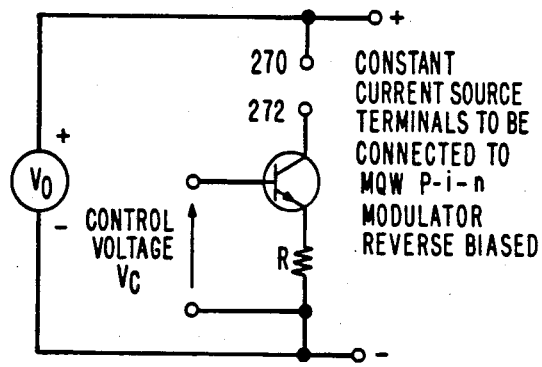
FIG. 20 is a schematic diagram showing the invention using a transistor.

An exemplary constant current source using a transistor and suitable for practicing the invention is shown in FIG. 20. A pin MQW diode structure modulator is connected in reverse bias configuration between contacts 270, 272. Voltage source $V_O$ provides a constant DC potential. As the photocurrent generated in the pin MQW diode structure attempts to change with changes in incident light intensity, the transistor will maintain the current constant and change the voltage between contacts 270, 272 accordingly. The pin MQW structure will then exhibit either bistability or linear inverting modulation as discussed hereinabove. Junction transistors and field effect transistor may equally well serve as a constant current source.

Figure 21:
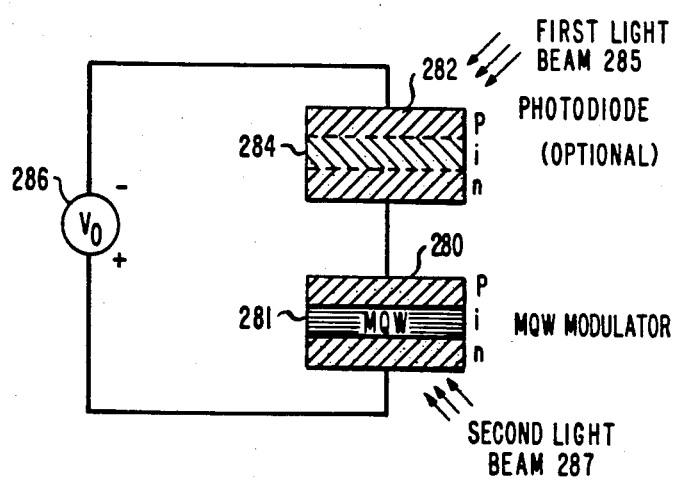
FIG. 21 is a schematic diagram showing the invention using a photodiode.

An exemplary embodiment of the invention having a photodiode as a constant current limiter is shown in FIG. 21. The MQW modulator 281 is shown as the intrinsic layer of a pin diode 280. The photodiode 282 is shown with an optional intrinsic layer 284. The intrinsic layer 284 is optionally included so that the depletion region will remain approximately the same size independent of bias. Light absorption occurring within the depletion region generates the diode photocurrent, and with the size of the depletion region substantially independent of bias, the photocurrent will be substantially independent of bias and only dependent on the absorbed optical power. For a pin diode 280 and MQW modulator 281 having a bistable characteristic, the operating point is controlled by the optical power absorbed by the photodiode 282. A first light beam 285 having a first spectral composition may be directed at photodiode 282 in order to control the constant current. A second light beam 287 having a second spectral composition may be controlled by pin diode 280 and MQW modulator 281.

In operation, the constant potential $V_o$ set by potential source 286 appears partly across photodiode 282 and partly across pin diode 280. The fraction of potential $V_O$ across the two components 280, 282 changes as the requirement for constant current in photodiode 282 requires. In the linear inverting modulator mode, an increase in intensity of the light beam absorbed by photodiode 282 causes an increase in current through the MQW modulator, and an increase in absorption of MQW layers 281. Thus an increase in intensity in the control light beam causes a decrease in intensity of the light beam transmitted through the pin diode 280, giving an decrease approximately linear with the increase in intensity of the control beam.

Figure 22:
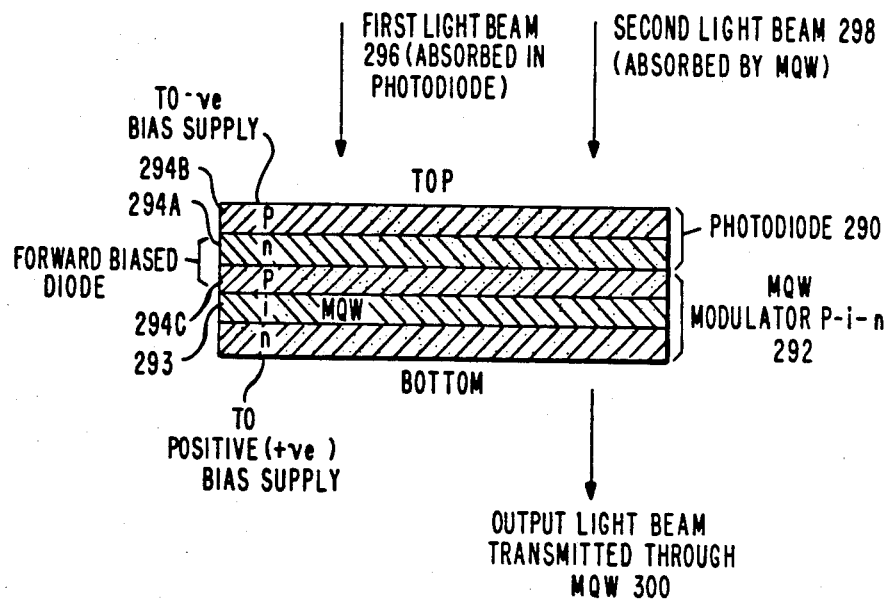
FIG. 22 is a side view showing the invention in an integrated structure with a photodiode or a phototransistor.

FIG. 22 shows an exemplary embodiment of the invention grown as an integrated photodiode 290 in electrical series with a pin diode MQW modulator 292. Photodiode 290 and pin MQW diode 292 are both reverse biased. Junction 294 is a forward biased diode, and so photocurrent produced within photodiode 290 can pass into pin MQW diode 292. Photodiode 290 is designed so that photocurrent is nearly independent of bias, and may include an intrinsic layer (not shown). A first light beam 296 is absorbed by photodiode 290 in order to make the constant "set" current. A second light beam 298 is transmitted by pin MQW diode 292 to become output light beam 300. The semiconductor structure shown in FIG. 22 will work with the photodiode 290 operating independently of the pin MQW diode 292 as discussed above if the wavelength and absorption for first light beam 296 is chosen so that it does not penetrate and become absorbed in MQW 293, and if second light beam 298 is not appreciably absorbed by photodiode 290. If either light beam 296, 298 is absorbed by both photodiode 290 and pin MQW diode 292, then a more complicated interaction occurs. The entire structure may, for example, be grown by molecular beam epitaxy from a single family of materials such as GaAs, GaAlAs, and the appropriate n and p doping materials. The semiconductor layers shown in FIG. 22 may exhibit transistor action. Inadvertent transistor action is called "parasitic transistor action" and the involved layers are called parasitic transistors. Transistor action may be enhanced or inhibited by the choice of thickness of materials in order to control diffusion of charge carriers from one semiconductor layer to another layer.

For example the pin MQW diode 292 may be operated with light beams directed perpendicular to the layer planes, as shown in FIG. 7, FIG. 8 or FIG. 22. The p and n regions of photodiode 290 absorb energy from first light beam 296, and they should be transparent at the wavelength of second light beam 298. For the GaAs/GaAlAs system this transparency may be achieved by making the photodiode entirely out of GaAlAs with a bandgap chosen to be higher than the photon energy used in second light beam 298. Also the use of superlattice material for photodiode 290 results in a higher bandgap for photodiode 290. The photon energy of first light beam 296 would then be chosen higher than the photon energy for second light beam 298. Similar techniques may be used for other material systems.

Figure 23:
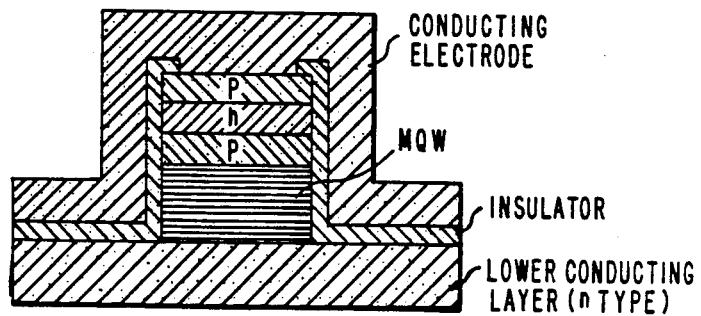
FIG. 23 is a side view showing the invention.

FIG. 23 shows an exemplary embodiment of an integrated photodiode and pin MQW diode structure. The layers may be grown by molecular beam epitaxy, a mesa etched, an insulating layer deposited, and a hole made in the insulator at the top of the mesa, and a conducting layer deposited so that it contacts the top layers of the mesa, much as discussed with reference to FIG. 9 and FIG. 10. Also structures as shown in FIG. 23 are suitable for fabrication into arrays, as discussed with reference to FIG. 11. An array of structures such as shown in FIG. 23 may be used to process numerous parallel light beams, and for other optical parallel processing. An array of structures as shown in FIG. 23 requires only two electrical conections for the array, as discussed above with reference to FIG. 11.

Figure 24:
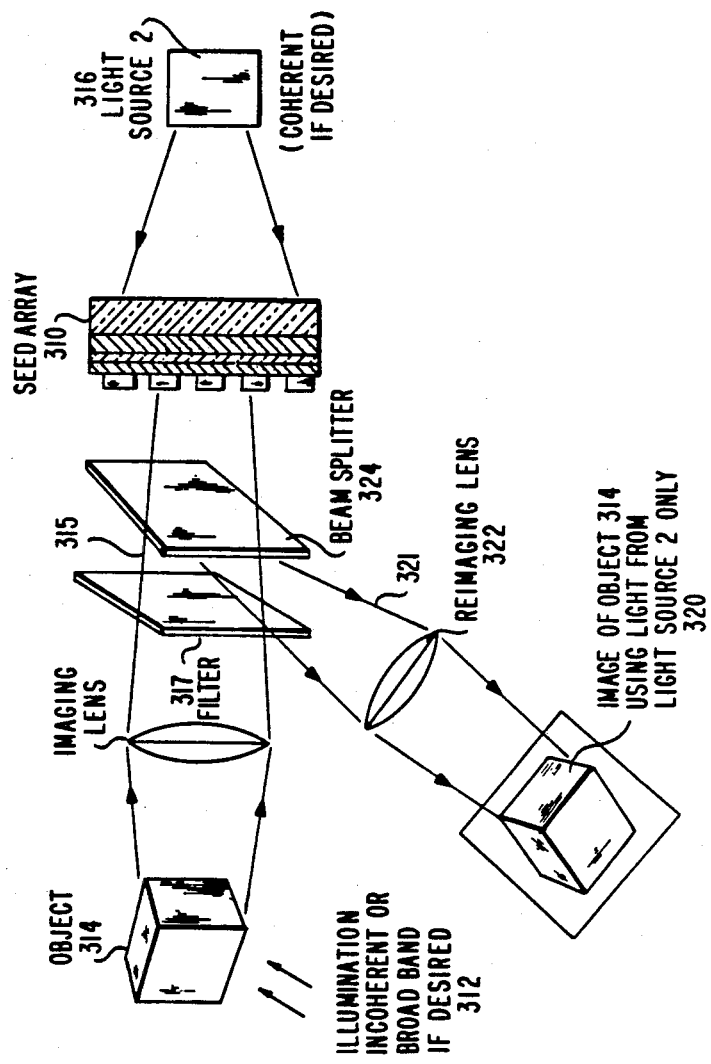
FIG. 24 is a schematic diagram showing the invention as a spatial light modulator.

In FIG. 24 an exemplary embodiment of the invention used as a spatial light modulator is shown. An array 310 of self electrooptic effect devices (SEED) as shown in FIG. 23 and FIG. 11, is used. Illumination 312, which may be incoherent and broadband, is directed toward an object 314. A fraction of illumination 312 is reflected from object 314, and is focused as light beam 315, after filtering out of key wavelengths by filter 317, onto an array 310 of SEED devices. Light source 316 illuminates array 310 of SEED devices. The transmission of each individual SEED device in array 310 depends upon the illumination intensity reflected by object 314. The wavelength used by source 316 is filtered out of light beam 315 by filter 317. Output beam 321 is formed by transmission of light from source 316 by SEED devices in array 310. The transmission state of the SEED devices is determined by the intensity of that part of the image of object 314 focused upon each SEED device. Output beam 321 is first deflected by beamsplitter 324, and then focused by a lens 322 to form an image 320. If a high intensity illumination of a SEED device in an array 310 results in low transmission of the SEED device for light from source 316, then the image 320 will be the negative of illuminated object 314. Image 320 may be formed at a wavelength completely different from wavelengths contained in illumination 312. For example, using GaAs/GaAlAs, SEED devices can use visible incoherent illumination 312, and produce an infra-red image 320 using a coherent light source at source 316.

Figure 25:
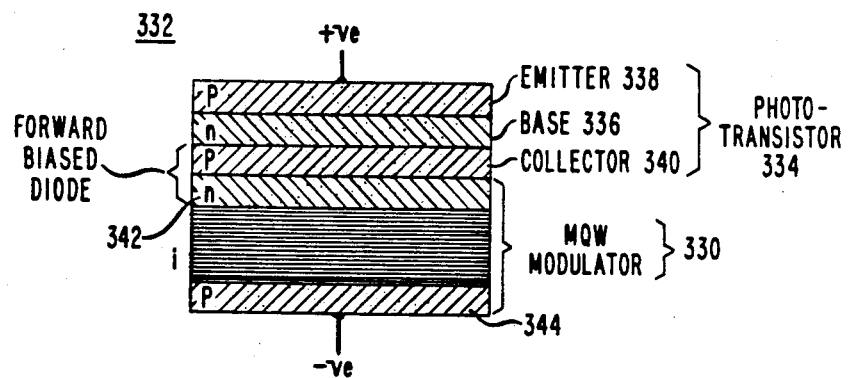
FIG. 25 is a side view of the invention integrated in a semiconductor body with a transistor.

FIG. 25 shows an exemplary embodiment of the invention having a phototransistor integrated into the MQW modulator structure. The device has only two electric connections. The base is not separately connected to any external electric circuit. The restriction of only two electrical contacts to a device was chosen so that an array of devices would not require more than just two electrical connections for the entire array, as discussed with reference to FIG. 11.

FIG. 25 shows an exemplary embodiment of the invention having a pin diode MQW structure 330 integrated into a semiconductor body 332, and also having a phototransistor 34 integrated into the semiconductor body 332. Phototransistor 334 is in electrical series with the pin diode structure 330. In operation, light is absorbed in the phototransistor and thereby produces a photocurrent. The photocurrent is amplified by transistor action among the emitter region 338, the base region 336, and the collector region 340. The amplified photocurrent is a substantially constant current supply much as is the transistor shown in FIG. 20, or the photodiode shown in FIG. 21. An advantage of the phototransistor shown in FIG. 25 is that the photocurrent generated by light absorption is amplified, thereby making the device more sensitive to light than the simple photodiode structure of FIG. 21. The phototransistor 334 functions as a constant current source and operates as described with reference to FIG. 16 through FIG. 19.

The semiconductor structure shown in FIG. 22 may serve as a phototransistor, as well as serving as a photodiode as described above. In FIG. 22 the n doped layer 294A serves as the base of a phototransistor, and the two p doped layers 294B, 294C, serve as emitter and collector, respectively. The semiconductor structure of FIG. 22 serves as a photodiode if the n doped layer 294A is made thick enough so that carriers cannot diffuse between layers 294B and layer 294C, or if some other means to prevent such carrier diffusion is used such as incorporating a tunneling junction as a carrier converter within layer 294A. However layers 294A, 294B, and 294C function as a phototransistor if the thickness of layer 294A is chosen sufficiently thin so that a significant number of carriers can diffuse from layer 294B to layer 294C. Although a pnp transistor is shown as in FIG. 25, an arrangement of a npn transistor will serve equally well as long as the pin MQW modulator is reverse biased. For example, in FIG. 25 each of the n layers may be replaced by a p layer, and each of the p layers may be replaced by an n layer, and the polarity of the supply voltage reversed.

When the semiconductor structure shown in FIG. 22 is constructed to function as a phototransistor it is a constant current source in series with the MQW modulator 293, and functions as described with reference to FIG. 16 through FIG. 19.

The integrated semiconductor structures shown in FIG. 22 and FIG. 25 are particularly well suited for fabrication into an array of individual devices much as is shown in FIG. 11. No electrical connection need be made to the base region of the phototransistors, and so an array needs only two electrical connections. For example, the semiconductor structure of FIG. 25, when incorporated into an array of similar devices, may have all of the device's layers 344 connected together electrically, and may have all of the device's layers 338 connected together electrically. The fabrication steps shown in FIG. 9 and FIG. 10 may be used to fabricate an array of devices as shown in FIG. 25, with the addition of steps required to make the additional layers shown in FIG. 25.

Figure 26:
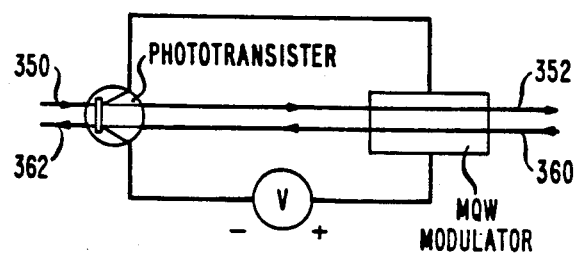
FIG. 26 is a schematic diagram showing the invention having the same light beam acting on a phototransistor and a MQW modulator.

FIG. 26 shows an exemplary embodiment of the invention having a phototransistor and a MQW modulator coupled by having both structures respond to the same light beam. The configuration shown in FIG. 26 may be made by using separate discrete components, or may be made using an integrated semiconductor structure such as shown in FIG. 22 and FIG. 25.

At least four separate cases of operation are possible using the embodiment of the invention shown in FIG. 26. The four cases are made by choosing whether the light beam penetrates the phototransistor first or penetrates the MQW modulator first, and secondly whether the absorption of the modulator increases or decreases with increasing external voltage applied to the modulator.

In the first case, the light beam penetrates the phototransistor first as shown by beam 350, and the absorption of the modulator increases with increasing voltage. Light beam 352 is the light output of the device. Operation of the device is analyzed by initially considering the light intensity to be very low and following the response of the device as the intensity is raised. At low intensity there is little photocurrent and most of the supply voltage is across the phototransistor. With increasing light intensity the photocurrent increases, the phototransistor current increases along with a decrease in emitter-collector voltage, and the voltage across the modulator increases. The modulator absorption increases with increasing modulator voltage, thereby reducing the intensity of the output light beam 352. The light output power plotted versus the light input power will therefore rise and then fall as the modulator absorption increases. By adjusting the operating point to be within the range wherein light output power decreases with increasing light input power the device can be used as an inverting amplifier.

In the second case the light beam penetrates the transistor first as light beam 350, however the absorption of the modulator decreases with increasing voltage. At low intensity there is very little photocurrent, most of the supply voltage is across the phototransistor, and consequently the modulator is very absorbing because the voltage across it is low. Output light beam 352 is therefore substantially blocked by the MQW modulator. As the intensity of beam 350 is increased the voltage across the MQW modulator increases, and the modulator becomes less absorbing, and the intensity of output light beam 352 rises rapidly.

For the third case the light beam penetrates the MQW modulator first and the phototransistor second, as shown by light beam 360, and the MQW absorption increases with increasing voltage. Light beam 360 is the input light beam, and light beam 362 is the output light beam. At low intensity the supply voltage is across the phototransistor and the MQW modulator is substantially transparent. As the intensity increases the phototransistor begins to conduct, causing the voltage across the MQW modulator to increase, and the modulator becomes more absorbing thereby blocking the light from reaching the phototransistor. With a proper choice of operating characteristics, the device will reach a constant transmitted power. In this case the invention serves as a light limiter.

For the fourth case the light penetrates the MQW modulator first as light beam 360, and the MQW modulator absorption decreases with increasing applied voltage. At very low intensity most of the supply voltage is across the phototransistor. Therefore the modulator is substantially opaque and little light penetrates to the phototransistor. However, as the light intensity is raised power begins to reach the phototransistor, the voltage across the phototransistor begins to drop, and the voltage across the MQW modulator begins to rise. The MQW modulator becomes increasingly transparent with increasing voltage. The phototransistor then sees a rapidly rising light intensity, leading to a rapidly rising light output power as the light input power is further increased.

Devices with additional characteristics may be made by illuminating either the phototransistor or the MQW modulator with additional beams of light (not shown). The operating point is adjusted by using the intensity of a light beam as the control element.

Figure 27:
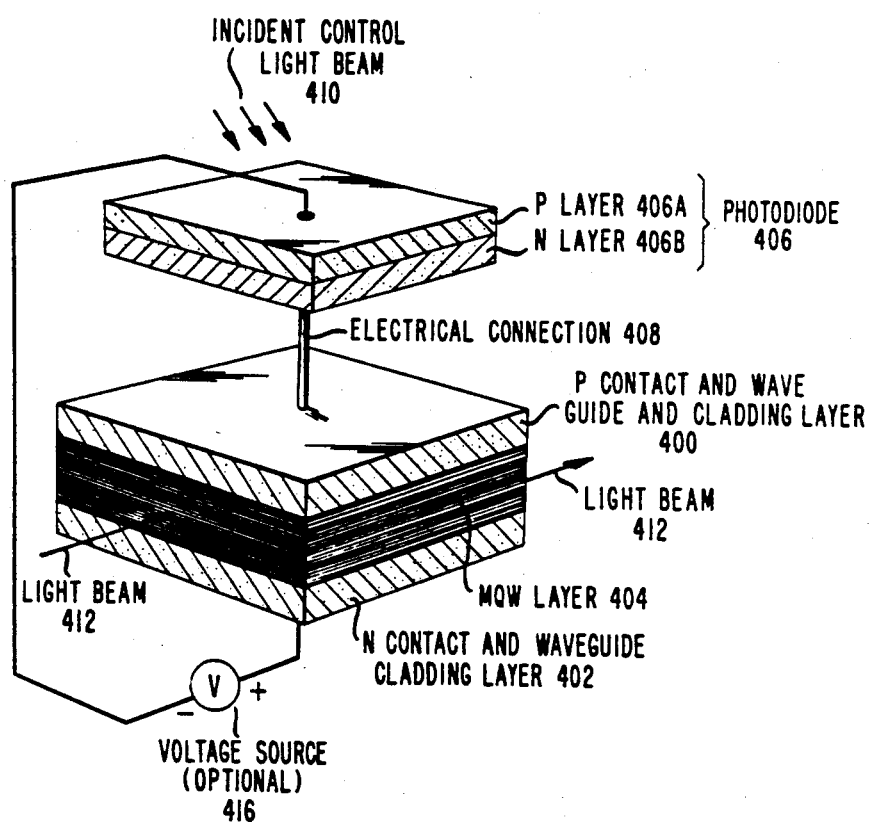
FIG. 27 is an isometric view showing the invention with a waveguide.

An exemplary embodiment of the invention in which the optical path length changes in response to light beam intensity is shown in FIG. 27. A modulator made with low refractive index p and n contact layers 400 and 402 around an intrinsically doped MQW layer 404 of higher refractive index than layers 400 and 402 serves as a modulator and an optical waveguide. Light beam 410 incident on photodiode 406 will generate a photocurrent which will cause the voltage over the MQW region 404 to change, thereby changing its absorption spectrum and its refractive index spectrum. If incident light beam 412 is chosen so that it is in a spectral region where the change in refractive index is significant, such as would be found for photon energies close to but lower than the exemplary operating point 147 in FIG. 6, then the optical path length seen by beam 412 on passing through the structure will be changed significantly. This property may be exploited to make optically controlled resonators, interferometers, directional couplers and other devices sensitive to optical path length. If the control light beam 410 is derived from the light beam 412 before, after or during its passage through the structure, devices may be made employing internal feedback, enabling the beam 412 to affect its own optical path length in a nonlinear manner.

Alternative structures may be made using phototransistors or other light sensitive materials and photodiodes and phototransistors may be integrated into the structure as described in FIG. 22 and FIG. 25 except the direction of the light beams may be different from that shown in FIGS. 22 and 25. Using the structures in FIGS. 22 and 25, the fringe field of the optical mode in the waveguide may be partially absorbed in the phototransistor or photodiode, thereby deriving the control beam from the incident light beam during the passage of the incident beam 412 through the structure.

A photoconductor may be used rather than a photodiode or phototransistor as shown in FIG. 21, FIG. 22, FIG. 23, FIG. 25, or FIG. 27, for controlling the optical absorption of the MQW structure.

Materials for making the MQW structures may include ternarys or quaternaries such as InGaAlAs, InGaAsP, InGaAs, InAl, As, and other semiconductor materials such as InP. For example alloys or compounds made of Group III-V elements and Group II-VI elements are particularly useful in making MQW structures.

Although the embodiments of the invention depicted in FIGS. 22 and 25 operate in the same general manner, discussed above, they exhibit different specific operating characteristics, which offer different advantages. For example, in the operation of the embodiment depicted in FIG. 22, an external voltage is applied across the (integrated and series-connected) photodiode 290 and MQW modulator 292. Under the influence of this voltage, a first light beam 296 (the control beam) is impinged upon, and largely absorbed by, the photodiode 290. In addition, a second impinging light beam (the bias beam) 298, having a different wavelength from the control beam 296, is largely transmitted by the photodiode 290 but partially absorbed by the MQW modulator 292. The portion of the bias beam 298 transmitted by the modulator constitutes the output beam 300 of the device.

As noted earlier, an increase in the power of the control beam 296 produces an increase in the photoconductivity (and thus a decrease in the electrical resistance) of the photodiode 290. This, in turn, results in a decrease in the voltage drop across the photodiode 290, and a corresponding increase in the voltage drop across the modulator 292. (Because the photodiode 290 and modulator 292 are in series, the sum of the voltage drops across these circuit elements must equal the externally applied voltage.) The increased voltage across the modulator produces, for example, an increase in the absorption coefficient of the modulator 292, resulting in a decrease in the intensity of the output beam 300.

If the photodiode 290 is replaced by a phototransistor (as discussed earlier), e.g., the n-region 294A is made sufficiently thin so that the regions 294A, 294B, and 294C constitute a bipolar transistor, then a significant advantage is realized. That is, in operating the series-connected photodiode 290 and modulator 292, a small change in the intensity of the control beam 296 produces only a small change in the photoconductivity of the photodiode 290, and thus only a small change in the absorption coefficient of the modulator 292, and hence only a small change in the intensity of the transmitted beam 300. By replacing the photodiode 290 with a phototransistor, the current amplification produced by the transistor yields a photoconductivity increase which is much larger than that produced by the photodiode (in response to the same small increase in the intensity of the control beam 296). Consequently, optical gain is achieved, i.e., a small increase in the intensity of the control beam 296 yields a large change in the absorption coefficient of the modulator 292, and hence a large change in the intensity of the output beam 300.

The embodiment of the invention depicted in FIG. 25 includes a phototransistor 334 integrated, and in series connection, with an MQW modulator 330. In one mode of operation, only light of a single wavelength (or a small range of wavelengths) impinges the device, i.e., the control and bias beams are of the same wavelength. This feature is advantageous because, among other reasons, it permits cascading of devices, i.e., the output of one device is readily used as the input to another device. (By contrast, the use of two beams, of different wavelength, in the embodiment of FIG. 22 generally precludes cascading.) In addition, the presence of the phototransistor yields optical gain. However, the effects of small (unwanted) intensity fluctuations in the bias beam are amplified by the phototransistor 334, resulting in relatively large, unwanted fluctuations in the intensity of the output beam. As a consequence, the incident light beam must generally be produced by a relatively expensive and relatively sophisticated optical source which avoids unwanted intensity fluctuations.

As discussed, the above embodiments exhibit different operating characteristics and different, corresponding advantages. Unfortunately, no one of these embodiments exhibits all of these advantages.

As shown in FIGS. 22 and 25, the above embodiments also include parasitic transistors. For example, the embodiment of FIG. 25 includes a parasitic p-n-p transistor which includes the p-region 340, the n-region 342, and the p-region 344. For most applications, the presence of these parasitic transistors has little or no adverse effect on the performance of the embodiments. However, in a few demanding applications, e.g., in applications where the optical gain is to be a large factor such as one hundred or more, the parasitic transistors can degrade performance.

A new embodiment of the invention has been developed which achieves all of the advantages of the above embodiments, and which also suppresses, or significantly reduces, parasitic transistor action. The structure of this new embodiment is depicted in FIG. 28, while the corresponding electrical circuit is depicted in FIG. 29.

Figure 28:
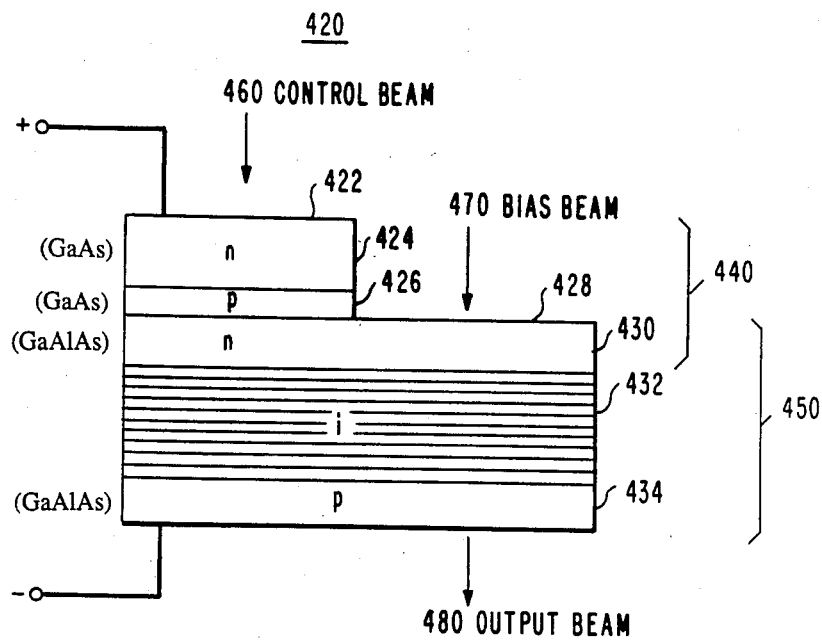
FIGS. 28 and 29 are, respectively, a cross-sectional view and a corresponding electrical circuit diagram of a new embodiment of the invention.
Figure 29:
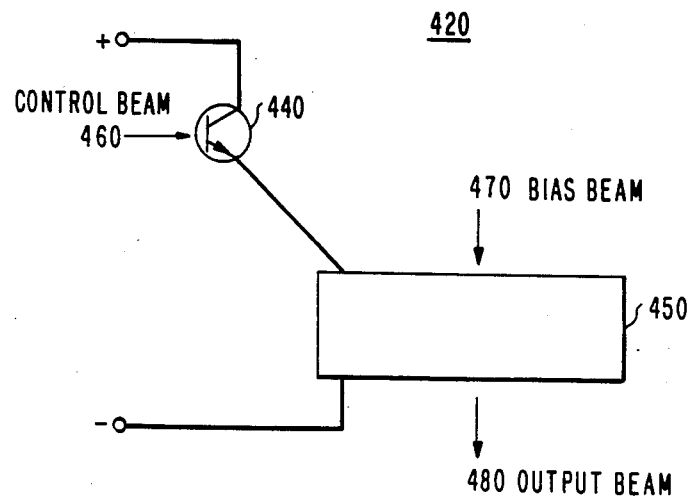

As shown in FIG. 28, the new embodiment 420 includes a phototransistor 440 integral, and in series, with a MQW modulator 450. The phototransistor 440 is, for example, an n-p-n bipolar transistor or a p-n-p bipolar transistor. For purposes of illustration only, the phototransistor depicted in FIG. 28 is an n-p-n transistor which includes an n-type material region 424 having an exposed upper surface 422, a p-type material region 426, and an n-type material region 430. These regions constitute, respectively, the collector, the base, and the emitter of the phototransistor 440 (which, in operation, is biased, as shown in FIG. 28).

The MQW modulator 450 is preferably in the form of a p-i-n diode which includes the n-type material region 430, a multi-quantum well region 432 (of intrinsic semiconductor material), and a p-type material region 434. Thus, one of the components of the phototransistor 440, i.e., the n-type region 430 (the emitter), is integral with the modulator 450. (If the phototransistor 440 is a p-n-p transistor, then the positions of the p-type and n-type regions in the modulator 450 are interchanged, and thus a p-type region of the phototransistor is integral with the modulator.)

Significantly, the phototransistor 440 is fabricated (as described more fully below) so that the base 426 and collector 424 overlie only a portion (less than all) of an upper surface 428 of the emitter 430 (the component integral with the modulator 450). This is highly advantageous because, in operation, a control beam 460 is readily impinged upon the exposed, upper surface 422 of the collector 424 (to penetrate into, and be absorbed by, the phototransistor 440). In addition, a bias beam 470 is readily impinged upon the exposed portion of the surface 428 (to penetrate into, and be at least partially absorbed by, the MQW region 432). Because the bias beam 470 need not penetrate the phototransistor (as was the case with the embodiment of FIG. 25), the wavelength of the bias beam need not be different from that of the control beam. As a consequence, device cascading is readily achievable. Moreover, and by virtue of the use of control and bias beams, the embodiment 420 achieves all of the other advantages, discussed above. In particular, small fluctuations in the bias beam are not amplified by the phototransistor.

As shown in FIG. 28, the embodiment 420 contains a p-n-p parasitic transistor which includes the p-type region 426, the n-type region 430, and the p-type region 434 (the presence of the intrinsic, MQW region 432 does not preclude parasitic transistor action). These regions constitute, respectively, the emitter, the base, and the collector of the parasitic transistor. To avoid undesirable operation in the demanding applications, discussed above, the current gain of the phototransistor 440 should be greater than that of the parasitic transistor. (As used here, the term current gain denotes what is commonly termed $\beta$, the dc short-circuit current gain in the common-emitter configuration.) As is known, there are a variety of techniques for enhancing or reducing the current gain of one transistor relative to another. In the embodiment of FIG. 28, it has been found useful to reduce the current gain of the parasitic transistor below that of the phototransistor 440 by, for example, reducing the emitter injection efficiency of the parasitic transistor below that of the phototransistor 440. This is readily achieved by forming the parasitic transistor with a base material region (the region 430) having a higher bandgap than that of the base region (region 426) of the phototransistor 440. (The term bandgap denotes the energy gap between the valence and conduction bands. The larger the bandgap, the larger is the potential barrier seen by majority carriers injected into the base by the emitter, and thus the lower the emitter injection efficiency.) That is, this is achieved by introducing a heterojunction at the interface between the regions 430 and 426. (Regarding heterojunctions see, e.g., H. Kroemer, *Proc. IEEE*, 70, No. 1, January 1982, pp. 13–25.) Assuming all other factors (affecting current gain) are equal, the bandgap of the base of the parasitic transistor should be greater than that of the base of the phototransistor by at least kT, where k is Boltzmann's constant and T is the desired operating temperature of the device (in degrees Kelvin). Bandgap differences smaller than kT are undesirable because they result in undesirably small reductions in the emitter injection efficiency of the parasitic transistor.

The desired bandgap difference is readily achieved by fabricating the base of the parasitic transistor (the region 430) from, for example, gallium aluminum arsenide (having a bandgap typically of about 1.8 eV). Further, the base of the phototransistor 440 (the region 426) is fabricated from, for example, gallium arsenide (having a bandgap of about 1.4 eV). For the sake of convenience, the remainder of the embodiment 420 is also fabricated from these same materials. That is, and as shown in FIG. 28, the region 424 includes gallium arsenide, the region 434 includes gallium aluminum arsenide, while the MQW region 432 includes interleaved regions of gallium arsenide and gallium aluminum arsenide (as described earlier).

The regions of gallium arsenide and gallium aluminum arsenide, described above, are readily grown on top of one another using, for example, conventional molecular beam epitaxy techniques. Further, a portion of the surface 428 is left exposed by, for example, selective deposition of the regions 424 and 426. Alternatively, the regions 424 and 426 are initially formed so that they entirely cover the surface 428, and then a portion of each of the regions 424 and 426 is etched away, using conventional etchants, to expose a portion of the surface 428.

Significantly, the use of different bandgap materials, as described above, also results in advantageous transmission and absorption properties. For example, if the regions 424 and 426 are of gallium arsenide, and the control beam 460 incident on the surface 422 includes light having a wavelength of, for example, 850 nanometers, then such light will be absorbed by the phototransistor 440. If the bias beam 470 incident on the exposed portion of the surface 428 also includes the same wavelength light (as is desirable for cascading purposes), and if the regions 430 and 434 are of gallium aluminum arsenide, then undesirable absorption of this light by these regions is avoided (by virtue of the higher bandgap of gallium aluminum arsenide). (Absorption of the bias beam by the regions 430 and 434 produces an undesirable attenuation of the output beam.) However, if the MQW region 432 includes interleaved regions of gallium arsenide and gallium aluminum arsenide, then the light will be absorbed by the MQW region, with the absorption being (indirectly) controlled by the control beam.

Figure 30:
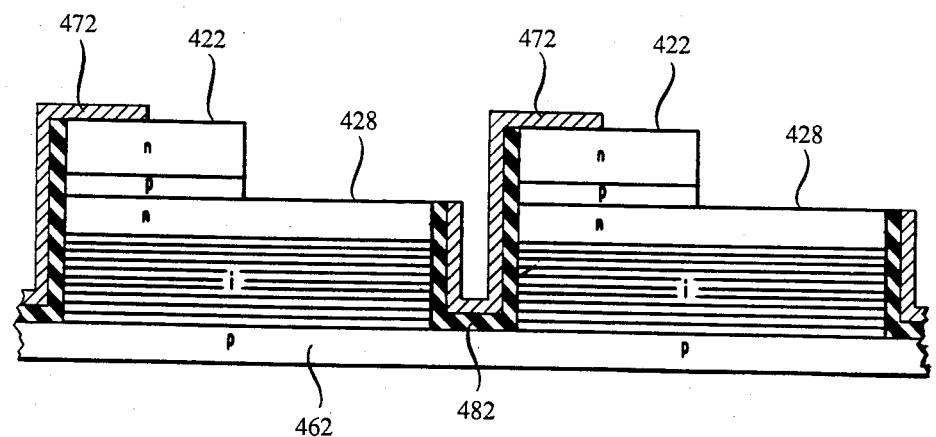
FIGS. 30 and 31 are, respectively, a cross-sectional view and a top view of a device which includes an array of the new embodiments.
Figure 31:
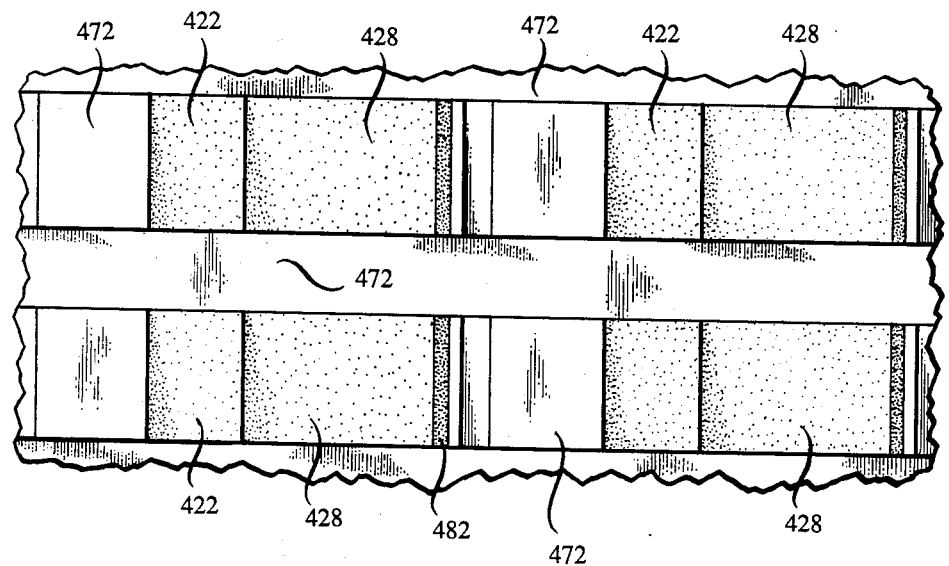

Because the embodiment 420 requires only two electrical contacts (to the top of (collector) region 424 and the bottom of region 434, as shown in FIG. 28), this embodiment lends itself to the formation of structures which include arrays of the embodiment having a common top contact and a common bottom contact. As shown in FIGS. 30–31, such an array includes a plurality of the embodiments 420, formed in a common substrate, with a common bottom electrical contact 462 to the common region 434. If the region 434 is, for example, of gallium aluminum arsenide, then the bottom contact includes, for example, the region 434 itself.

A common top contact 472 to the regions 424 (the collector) of the array is formed by first forming, e.g., depositing, an insulating layer 482 covering all the upper surfaces of the array except the surfaces 422 and 428 (which are to be impinged by the control and bias beams). This insulating layer shields array components from the voltages applied to the emitter regions of the array via the common top contact. If the array is fabricated from gallium arsenide and gallium aluminum arsenide, then useful insulating materials include polyimide, silicon oxide, and silicon nitride. Then the common top contact 472 is formed by depositing the contact layer (or layers) onto all the upper surfaces of the array, including a portion of each surface 422 of each emitter. However, at least a portion of each surface 422 is left exposed for impingement by a control beam. In addition, the surfaces 428 are also left exposed for impingement by the bias beams.

Figure 32:
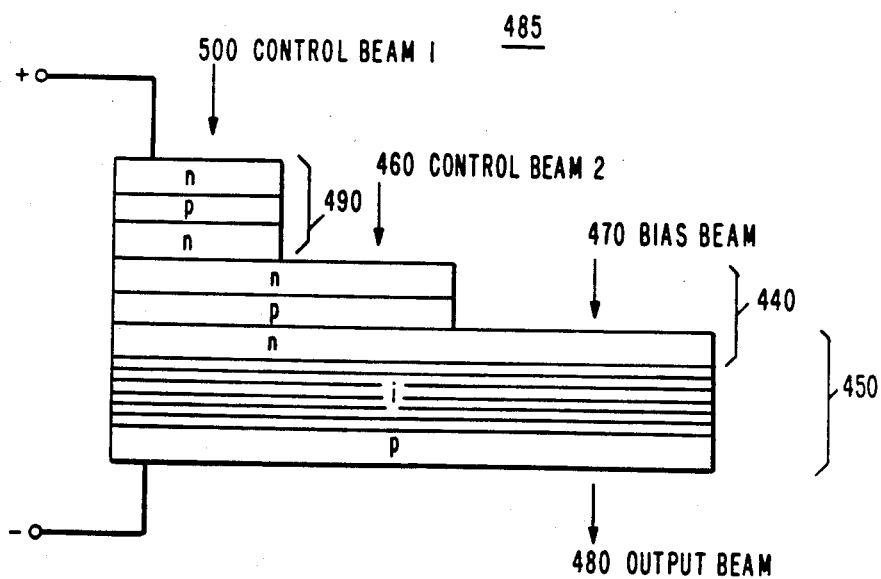
FIGS. 32 and 33 are, respectively, a cross-sectional view and a corresponding electrical circuit diagram of an optical logic device which includes the new embodiment.
Figure 33:
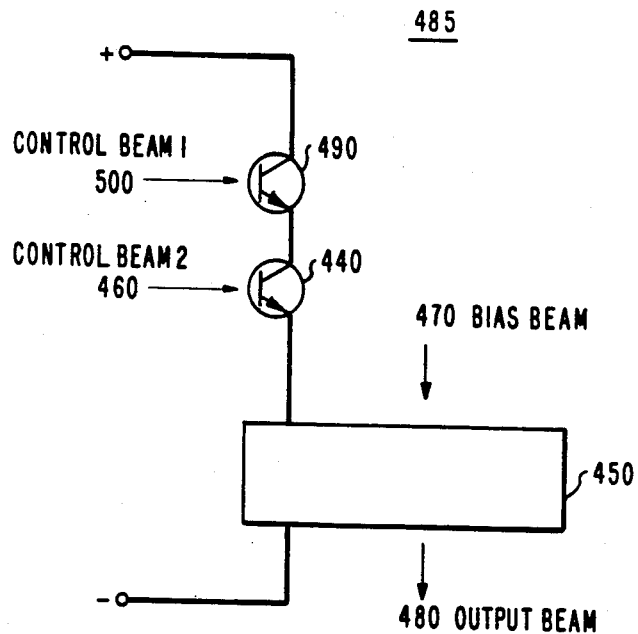

The new embodiment of the invention is further advantageous because it is readily adaptable for use in optical logic devices. For example, the structure 485 depicted in FIG. 32, which includes a phototransistor 490 in series with the embodiment 420, constitutes an optical NAND gate. (The corresponding electrical circuit is depicted in FIG. 33.) That is, the applied voltage is dropped across the modulator 450, thus attenuating the output beam 480, only if both phototransistors 490 and 440 are turned on by the control beams 500 and 460.

Preferably, for the demanding applications discussed above, the current gain of each of the phototransistors 490 and 440 is greater than that of the parasitic transistor inherent in the new embodiment. However, for other, nondemanding applications, this requirement is not essential.

What is claimed is:

1. An optical device, comprising:
   first means, including a first surface, capable of absorbing electromagnetic radiation incident on said first surface, the absorption and/or refractive index of said first means being alterable by applying a voltage across said first means and/or through alterations in said applied voltage; and
   second means for producing a voltage across said first means, said voltage being alterable in response to electromagnetic radiation incident on, and absorbed by, said second means, Characterized In That
   said first means further includes a quantum well region, and said second means includes at least a first component integral with said first means and at least a second component overlying a portion, but less than all, of said first surface.

2. The optical device of claim 1 wherein said second means includes a phototransistor.

3. An optical device, comprising:
   first means, capable of absorbing incident electromagnetic radiation, the absorption and/or refractive index of said first means being alterable by applying a voltage across said first means and/or through alterations in said applied voltage;
   second means for producing a voltage across said first means, said produced voltage being alterable in response to electromagnetic radiation incident on, and absorbed by, said second means, Characterized In That
   said first means further includes a quantum well region, and said second means includes a phototransistor, a current gain of said phototransistor being greater than that of a parasitic transistor inherent in said device.

4. The optical device of claim 3 wherein said phototransistor and parasitic transistor each includes an emitter, a base and collector, a bandgap of the base of said parasitic transistor being greater than a bandgap of the base of said phototransistor.

5. The optical device of claim 4 wherein the emitter, base and collector of said phototransistor include, respectively, gallium aluminum arsenside, gallium arsenide, and gallium aresenide, while the emitter, base and collector of said parasitic transistor include, respectively, gallium arsenide, gallium aluminum arsenide, and gallium aluminum arsenide.

6. An optical device, comprising:
   first means, capable of absorbing incident electromagnetic radiation, the absorption and/or refractive index of said first means being alterable by applying a voltage across said first means and/or through alterations in said applied voltage; and
   second means for producing a voltage across said first means, said produced voltage being alterable in response to electromagnetic radiation incident on, and absorbed by, said second means, Characterized In That
   said first means includes a quantum well region, and said second means includes first and second phototransistors.

7. The optical device of claim 6 wherein a current gain of each of said phototransistors is greater than that of a parasitic transistor inherent in said device.

* * * * *

UNITED STATES PATENT AND TRADEMARK OFFICE
CERTIFICATE OF CORRECTION

PATENT NO. : 4,716,449

DATED : December 29, 1987

INVENTOR(S) : David A. B. Miller

It is certified that error appears in the above-identified patent and that said Letters Patent is hereby corrected as shown below:

Column 8, line 60, "as" should be --is--.
Column 11, line 28, "when" should be --then--.
Column 14, line 53, "34" should be --334--.

Signed and Sealed this

Fifteenth Day of May, 1990

Attest:

HARRY F. MANBECK, JR.

Attesting Officer

Commissioner of Patents and Trademarks